US010270392B1

United States Patent
Lai et al.

(10) Patent No.: US 10,270,392 B1
(45) Date of Patent: Apr. 23, 2019

(54) LOW-POWER DIFFERENTIAL AMPLIFIER WITH IMPROVED UNITY GAIN FREQUENCY

(71) Applicant: QUALCOMM Incorporated, San Diego, CA (US)

(72) Inventors: Tony Lai, Chandler, AZ (US); Mohammad Tabish Siddiqui, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/821,616

(22) Filed: Nov. 22, 2017

(51) Int. Cl.
*H03F 3/45* (2006.01)
*H03F 1/02* (2006.01)

(52) U.S. Cl.
CPC ......... *H03F 1/0205* (2013.01); *H03F 3/4521* (2013.01); *H03F 2200/411* (2013.01); *H03F 2203/45022* (2013.01)

(58) Field of Classification Search
CPC .... H03F 3/45; H03F 3/45071; H03F 3/45237; H03F 3/45242
USPC ........................................ 330/253, 255, 261
See application file for complete search history.

(56) References Cited

U.S. PATENT DOCUMENTS

| | | | |
|---|---|---|---|
| 3,991,380 A * | 11/1976 | Pryor | H03F 3/45237 330/253 |
| 5,841,317 A | 11/1998 | Ohmori et al. | |
| 6,833,760 B1 | 12/2004 | Aude | |
| 8,279,004 B2 | 10/2012 | Wang | |
| 8,760,169 B2 | 6/2014 | Tang | |
| 2016/0344355 A1 | 11/2016 | Siniscalchi | |

* cited by examiner

*Primary Examiner* — Steven J Mottola
(74) *Attorney, Agent, or Firm* — Haynes and Boone, LLP (36340)

(57) ABSTRACT

A two-stage fully-differential amplifier achieves a relatively high unity gain frequency yet has the current consumption by a second stage limited by a bias transistor that supplies current to an internal power supply rail. The internal power supply rail supplies power to two pairs of transistors for the second stage.

16 Claims, 4 Drawing Sheets

LOW-POWER DIFFERENTIAL AMPLIFIER WITH IMPROVED UNITY GAIN FREQUENCY

TECHNICAL FIELD

This application relates to differential amplifiers, and more particularly to a low-power fully-differential amplifier with an improved unity gain frequency.

BACKGROUND

Many differential amplifiers have two stages and thus have two poles in their frequency response. The second pole for a two-stage differential amplifier lowers the unity gain frequency and thus degrades the bandwidth and phase margin for the amplifier. But a relatively large phase margin in important to allow the amplifier to respond quickly to any transient disturbances. A stable two-stage differential amplifier design thus forces the second pole frequency as high as possible to increase the unity gain frequency and operating stability. But the increased phase margin then comes at the cost of increased power consumption.

The conflict between providing an increased unity gain frequency and reducing power consumption may be better appreciated through a consideration of a conventional two-stage differential amplifier 100 shown in FIG. 1. A first stage includes a p-type metal oxide semiconductor (PMOS) transistor P1 having a drain connected to the drain of an n-type metal oxide semiconductor (NMOS) transistor M1. Similarly, the first stage includes a PMOS transistor P2 having a drain connected to the drain of an NMOS transistor M2. A differential input signal formed by the difference between a positive input signal inp and a negative input signal inn drives the first stage. In particular, positive input signal inp drives the gates of transistors P2 and M2 whereas negative input signal inn drives the gates of transistors P1 and M1. A PMOS transistor P5 having its gate driven by a first bias signal pbias connects between the sources of transistors P1 and P2 and a power supply rail supplying a power supply voltage VDD. To complete the first stage, an NMOS transistor M5 having its gate driven by a second bias signal nbias connects between the sources of transistors M1 and M2 and ground.

A second stage for two-stage differential amplifier 100 includes a PMOS transistor P3 having a source connected to the power supply rail and a drain connected to a drain of an NMOS transistor M3 having its source tied to ground. The drains of transistors M1 and P1 in the first stage act as an input node for the second stage and are thus tied to the gates of transistors P3 and M3. A capacitor C and a resistor R are connected in series between this input node and the drains of transistors P3 and M3 for compensation. Similarly, the second stage also includes a PMOS transistor P4 in series with an NMOS transistor M4 that respond to the drains of first stage transistors P2 and M2. Another capacitor C in series with a resistor R compensates the response of transistors P4 and M4. The drains of transistors P4 and M4 form a positive output node whereas the drains of transistors P3 and M3 form a negative output node.

The resulting two-stage operation is quite advantageous since each stage includes complementary pairs of PMOS and NMOS transistors and thus has a double transconductance boost in gain as compared to single transistor (Class A amplifier) architectures. In addition, the pole from the second stage has its frequency boosted by the increase in gain for the second stage, which increases the unity gain frequency (increased phase margin) and stability for two-stage differential amplifier 100. But note that the current consumption for the second stage is not controlled by any bias transistors such as transistors P5 and M5. Two-stage differential amplifier 100 will thus have relatively high power consumption that is also subject to process variations.

Another conventional two-stage differential amplifier 200 is shown in FIG. 2. The first stage is as discussed with regard to two-stage differential amplifier 100. But the second stage differs in that the source of transistor P3 couples through a PMOS transistor P6 to the power supply rail. Similarly, the source of transistor P4 couples to the power supply rail through a PMOS transistor P7. A bias signal pbias2 drives the gates of transistors P6 and P7 to control the amount of current used by the second stage. Two-stage differential amplifier 200 thus consumes less power than two-stage differential amplifier 100 and is less subject to process variations. But this increase in power efficiency comes at the cost of the degeneration in transconductance for transistors P3 and P4 by the resistance presented by transistors P6 and P7, respectively. This second pole frequency for two-stage differential amplifier 200 is thus reduced compared to two-stage differential amplifier 100. This reduction in second pole frequency reduces the unity gain frequency and thus reduces the stability and phase margin.

There is thus a need in the art for a two-stage differential amplifier with low power consumption and a relatively high unity gain frequency.

SUMMARY

A two-stage fully-differential amplifier is provided in which each stage is a double transconductance stage. A first stage for the two-stage fully-differential amplifier thus includes two pairs of transistors. Similarly, a second stage for the two-stage fully-differential amplifier also includes two pairs of transistors. To provide low power consumption without degenerating the transconductance for the second stage, the second stage is powered by an internal power supply rail. A bias transistor controls the amount of current supplied to the internal power supply rail and thus controls the current consumption by the second stage. But this bias transistor does not degenerate the transconductance gain for the second stage because the internal power supply rail functions as an AC ground to the two pairs of transistors in the second stage. The resulting two-stage fully-differential amplifier thus has low power consumption yet still achieves a relatively large unity gain frequency.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A two-stage differential amplifier is provided that is low power yet has a relatively large unity gain frequency. To reduce the power consumption the second stage is powered by an internal power supply rail. A bias transistor controls the amount of current supplying the internal power supply rail to control the power (current) consumption of the second stage. Each stage in the two-stage differential amplifier is a double transconductance stage using two transistors. Since each stage is fully differential, each stage includes two pairs of transistors to supply the double transconductance boost in gain.

The two pairs of transistors in the second stage are powered by the internal power rail. The bias transistor controls the total current consumed by the second stage. With respect to this total current, one of the transistor pairs in the second stage will conduct more than the other depending upon the binary state of a differential input signal driving the first stage. As one transistor pair conducts more, the remaining transistor pair conducts less. But the total current consumed remains the same such that the internal power supply rail functions as an alternating current (AC) ground to the two pairs of transistors in the second stage. The bias transistor thus does not degenerate the transconductance of a PMOS transistor in each of the transistor pairs in the second stage such that the unity gain frequency for the resulting two-stage differential amplifier is relatively robust despite its low power operation.

Figure 1:
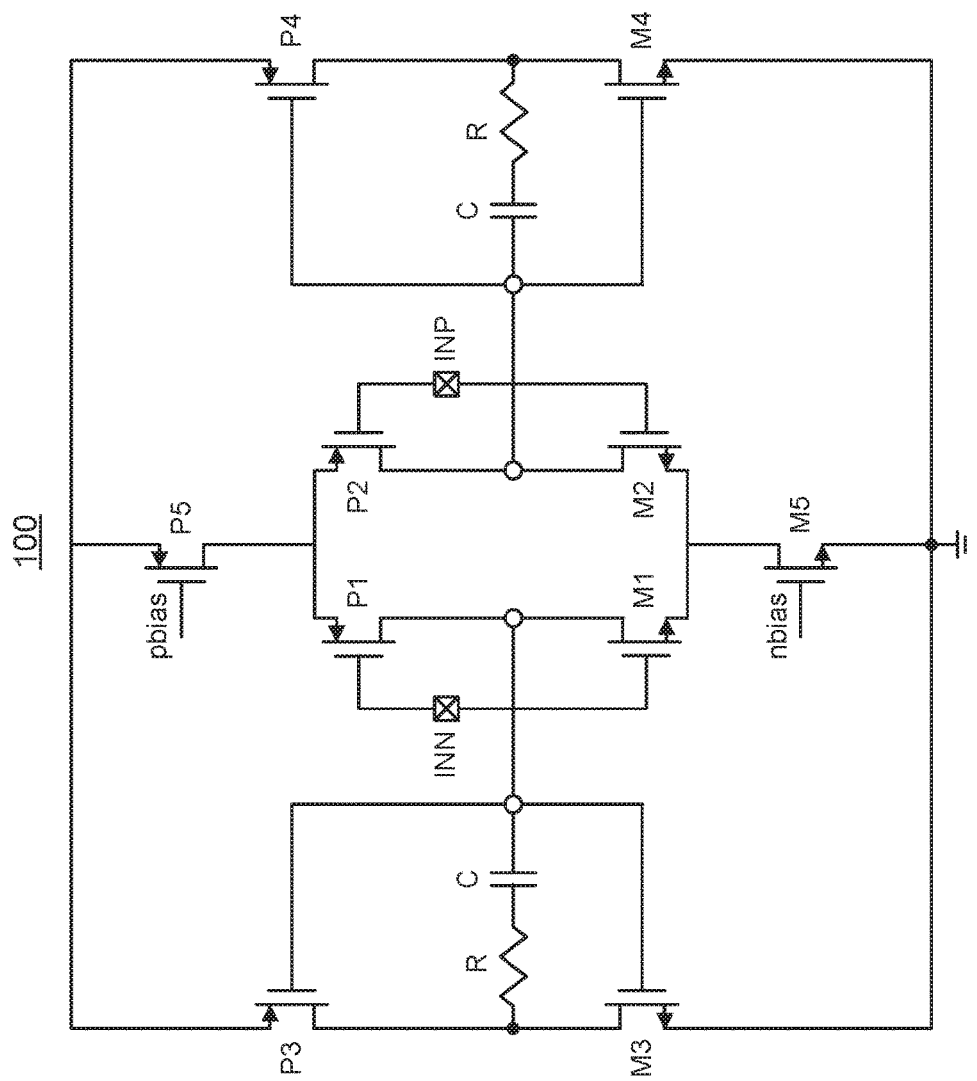
FIG. 1 is a circuit diagram of a conventional two-stage differential amplifier having a relatively large unity gain frequency at the cost of increased power consumption.
Figure 2:
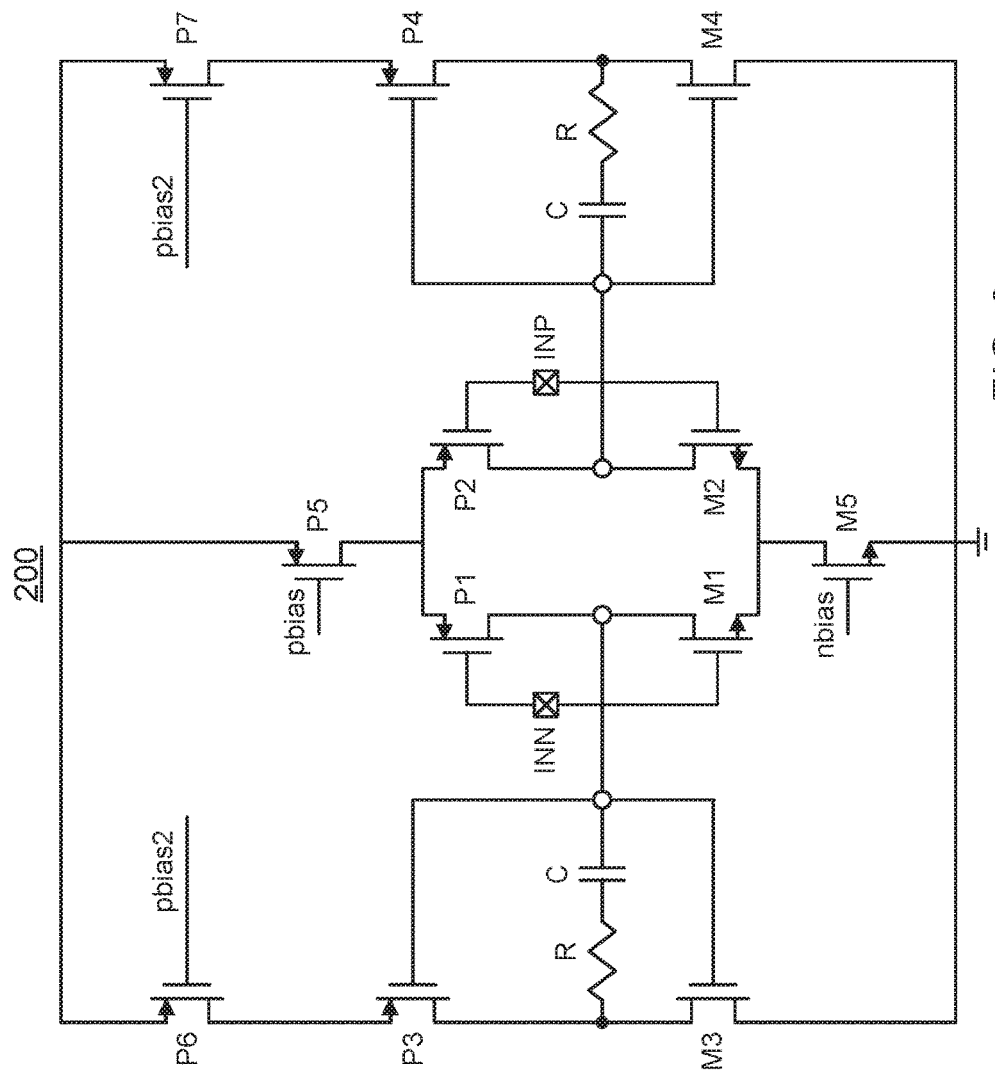
FIG. 2 is a circuit diagram of a conventional two-stage differential amplifier having reduced power consumption at the cost of a reduced unity gain frequency.
Figure 3:
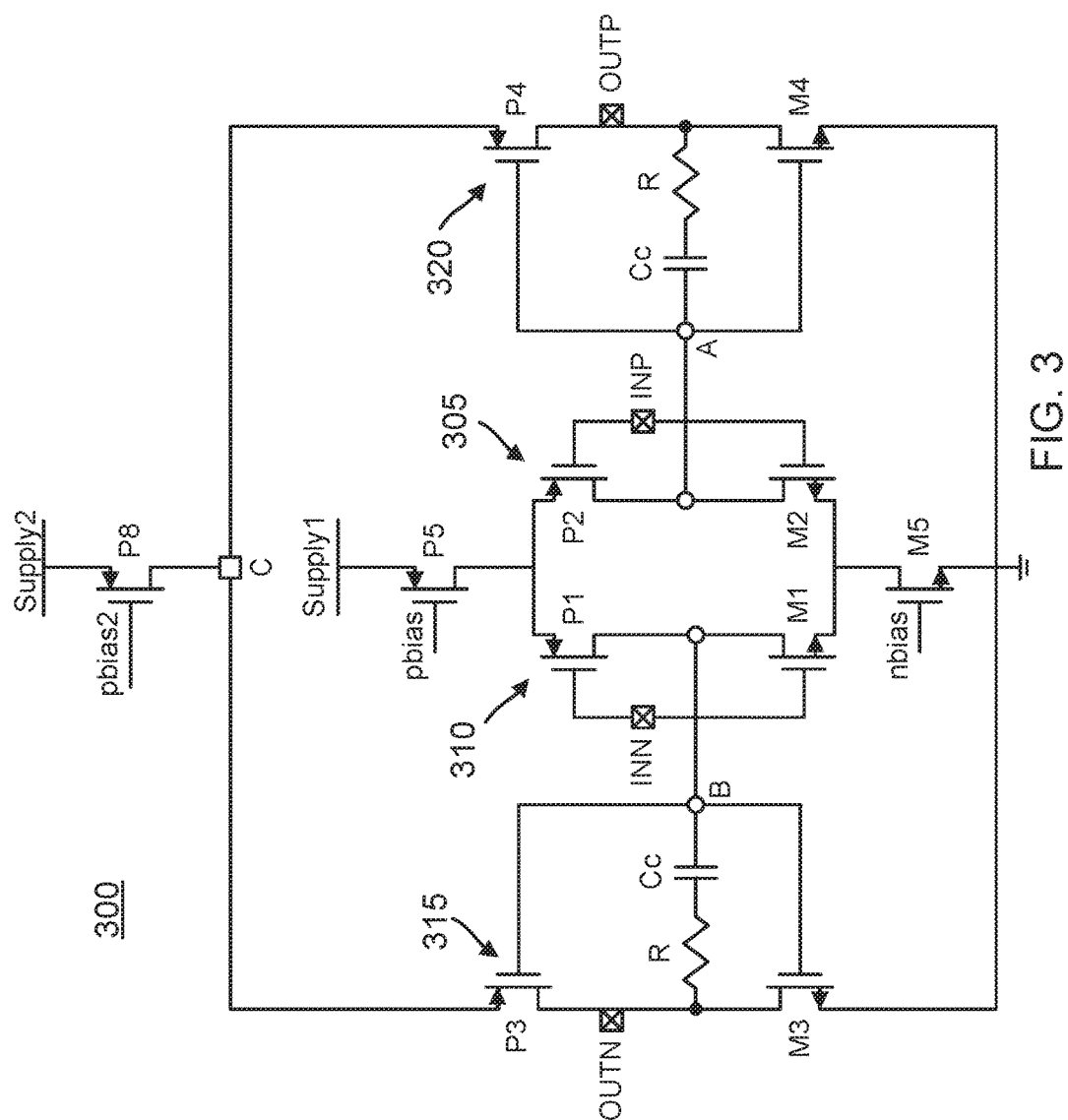
FIG. 3 is a circuit diagram of a two-stage differential amplifier that is both low power while still having a relatively large unity gain frequency in accordance with an aspect of the disclosure.

An example two-stage differential amplifier 300 is shown in FIG. 3. Analogous to two-stage differential amplifiers 100 and 200, both the first stage and the second stage in two-stage differential amplifier 300 each includes two pairs of transistors. The gain from each stage is thus a double transconductance gain. In particular, a first stage in two-stage differential amplifier 300 includes a first pair 305 of transistors and a second pair 310 of transistors. Similarly, a second stage in two-stage differential amplifier 300 includes a first pair 320 of transistors and a second pair 315 of transistors. In the first stage, first pair 305 of transistors is formed by a PMOS transistor P2 having a drain connected to the drain of an NMOS transistor M2. Similarly, the first stage's second pair of transistors 310 is formed by a PMOS transistor P1 having a drain connected to the drain of an NMOS transistor M1. A differential input signal formed by the difference between a positive input signal inp and a negative input signal inn drives the first stage. In particular, positive input signal inp drives the gates of transistors P2 and M2 in first pair 305 whereas negative input signal inn drives the gates of transistors P1 and M1 in second pair 310. A PMOS transistor P5 having its gate driven by a first bias signal pbias connects between the sources of transistors P1 and P2 and a first power supply rail supplying a first power supply voltage (Supply1). To complete the first stage, an NMOS transistor M5 having its gate driven by a second bias signal nbias connects between the sources of transistors M1 and M2 and ground. The drains of transistors P2 and M2 form a first stage positive output node A for driving the first pair 320 of transistors in the second stage. Similarly, the drains of transistors P1 and M1 form a first stage negative output node B for driving the second pair 315 of transistors in the second stage. The first stage thus drives a first stage differential output signal across the first stage output nodes A and B to the second stage responsive to the differential input signal.

The second pair of transistors 315 for the second stage in two-stage differential amplifier 300 is formed by a PMOS transistor P3 having a source connected to an internal power supply rail C and a drain connected to a drain of an NMOS transistor M3 having its source tied to ground. First stage negative output node B is tied to the gates of transistors P3 and M3. A capacitor Cc and a resistor R are connected in series between the first stage negative output node B and the drains of transistors P3 and M3 for compensation. Similarly, the first pair of transistors 320 in the second stage is formed by a PMOS transistor P4 having a source tied to the internal power supply rail and a drain connected to a drain of an NMOS transistor M4 having its source tied to ground. First stage positive output node A is tied to the gates of transistors P4 and M4. Another capacitor Cc in series with a resistor R coupled between first stage positive output node A and the drains of transistors P4 and M4 compensates the response of transistors P4 and M4. The drains of transistors P4 and M4 form a positive output node outp whereas the drains of transistors P3 and M3 form a negative output node outn for two-stage differential amplifier 300. The two stages thus function to amplify the differential input signal to form a differential output signal across the output nodes outp and outn.

A PMOS bias transistor P8 controls the amount of current consumed by the second stage by coupling between the internal power supply rail and a second power supply rail supplying a power supply voltage Supply2. In particular, a source for bias transistor P8 connects to the second power supply rail whereas its drain connects to the internal power supply rail. A bias signal voltage pbias2 driving the gate of transistor P8 controls the amount of current consumed by the second stage. By setting the value for the bias voltage pbias2, a circuit designer may thus control the current consumption of the second stage. For example, suppose that the bias voltage pbias2 is set to a level such that it conducts 10 µA. This current is then split between the two pairs 315 and 320 of transistors in the second stage depending upon the binary state of the differential input signal. In general, the average (direct current (DC)) current consumed by one pair of transistors will equal the average current consumed by the other pair of transistors. But depending upon the differential input signal binary state, one pair of transistors will conduct more than this average amount by some delta. But the remaining pair of transistors will then conduct less than the average amount by the same delta. The internal power supply rail thus functions as an AC ground to the second stage such that the transconductance gain for transistors P3 and P4 is not degenerated by whatever resistance is presented by bias transistor P8. This is quite advantageous in that two-stage differential amplifier 300 thus has a low power consumption like conventional two-stage differential amplifier 200 while having the relatively large unity gain of conventional two-stage differential amplifier 100. The problems that vexed the prior art are thus solved. Due to the voltage drop across bias transistor P8, it is convenient for the second power supply voltage Supply2 to be slightly higher than the first power supply voltage Supply1. However, in alternative implementations, the same power supply voltage can be used to power the two stages. The first and second power supply rails would thus be the same rail in that case. In one implementation, bias transistor P8 and the internal power supply rail may be deemed to form a means for means for supplying a controlled amount of current to the second stage without degenerating a transconductance gain for the second stage. It will be appreciated that other types of resistive and capacitive compensation circuits besides the serial combination of capacitor Cc and resistor R may be used to compensate a two-stage differential amplifier as disclosed herein.

Figure 4:
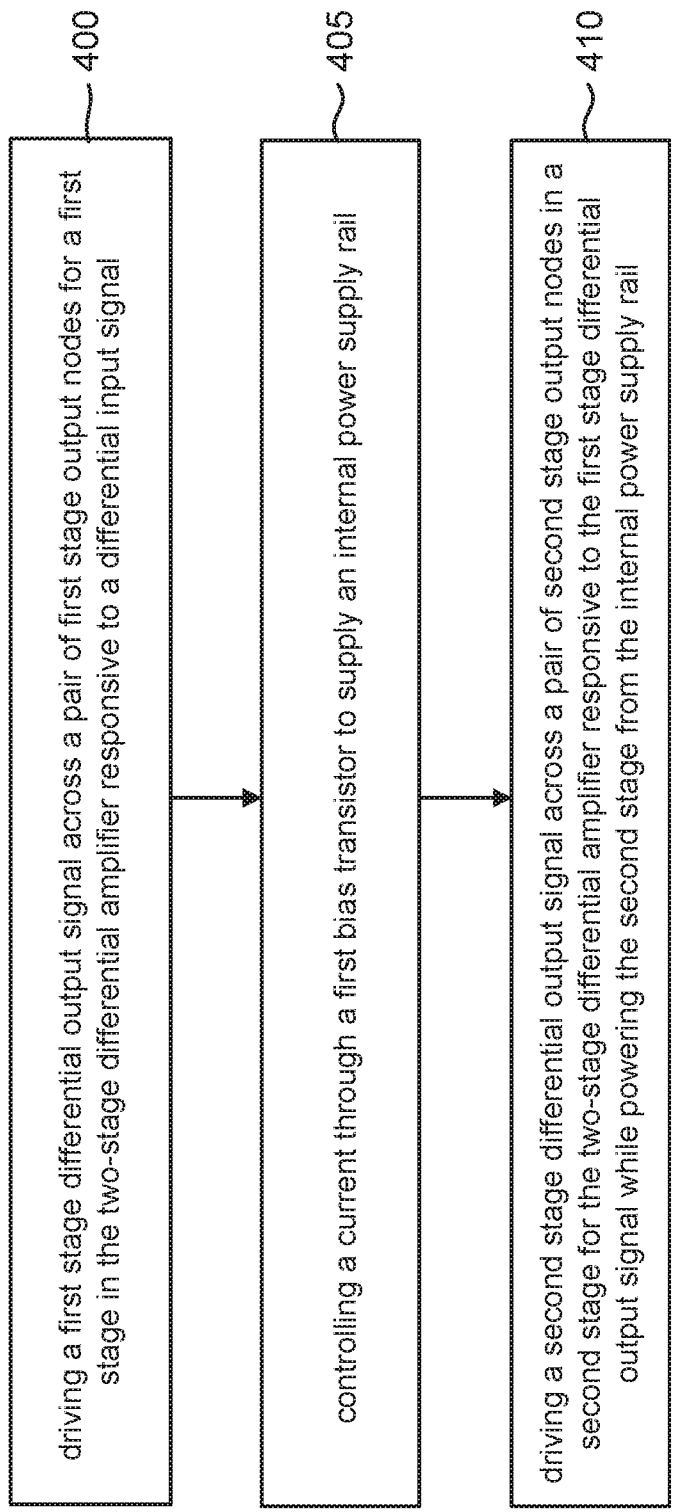
FIG. 4 is flowchart for a method of operation for a two-stage differential amplifier in accordance with an aspect of the disclosure.

A method of operation for a two-stage differential amplifier in accordance with an aspect of the disclosure will now be discussed with regard to the flowchart of FIG. 4. The method includes an act 400 of driving a first stage differential output signal across a pair of first stage output nodes for a first stage in the two-stage differential amplifier responsive to a differential input signal. The driving of nodes A and B as discussed with regard to two-stage differential amplifier 300 is an example of act 400. The method further includes an act 405 of controlling a current through a bias transistor to supply a power supply rail. The control of the second stage current by transistor P8 in two-stage differential amplifier 300 is an example of act 405. Finally, the method includes an act 410 of driving a second stage differential output signal across a pair of second stage output nodes in a second stage for the two-stage differential amplifier responsive to the first stage differential output signal while powering the second stage from the power supply rail. The driving of output nodes outp and outn with the differential output signal from the second stage of two-stage differential amplifier 300 is an example of act 410.

Those of ordinary skill will appreciate that numerous modifications may be made to the two-stage differential amplifier discussed herein. For example, It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A two-stage differential amplifier, comprising:
  a first stage including two pairs of transistors configured to drive a pair of first stage output nodes with a first stage output signal responsive to a differential input signal;
  an internal power supply rail;
  a bias transistor configured to supply a bias current to the internal power supply rail; and
  a second stage including two pairs of transistors configured to drive a pair of second stage output nodes with a second stage output signal responsive to the first stage output signal, wherein each pair of transistors in the second stage is coupled between the internal power supply rail and ground.

2. The two-stage differential amplifier of claim 1, wherein the bias transistor comprises a first p-type metal oxide semiconductor (PMOS) bias transistor having a source connected to a first power supply rail and a drain connected to the internal power supply rail, and wherein a current consumed by the second stage equals the bias current.

3. The two-stage differential amplifier of claim 2, wherein a PMOS transistor in each pair of transistors in the second stage has a source connected to the internal power supply rail.

4. The two-stage differential amplifier of claim 2, wherein each pair of transistors in the first stage comprises a PMOS transistor in series with an n-type metal oxide semiconductor (NMOS) transistor.

5. The two-stage differential amplifier of claim 4, further comprising:
  a second power supply rail, and
  a second PMOS bias transistor having a source tied to the second power supply rail, wherein the PMOS transistor in each pair of transistors in the first stage has a source connected to a drain of the second PMOS bias transistor and has a drain connected to a drain of the pair's NMOS transistor.

6. The two-stage differential amplifier of claim 5, wherein the first power supply rail is configured to supply a first power supply voltage and the second power supply rail is configured to supply a second power supply voltage, and wherein the first power supply voltage is greater than the second power supply voltage.

7. The two-stage differential amplifier of claim 4, further comprising:
  an NMOS bias transistor having a source coupled to ground, wherein the NMOS transistor in each pair of transistors in the first stage has a source coupled to a drain of the NMOS bias transistor.

8. The two-stage differential amplifier of claim 4, wherein each pair of transistors in the second stage comprises a PMOS transistor in series with an NMOS transistor, and wherein the drains for the transistors in a first one of the pairs of transistors in the first stage are connected to a gate for each transistor in a first one of the pairs of transistors in the second stage.

9. The two-stage differential amplifier of claim 8, wherein the drains for a second one of the pairs of transistors in the first stage are connected to a gate for each transistor in a second one of the pairs of transistors in the second stage.

10. The two-stage differential amplifier of claim 9, further comprising:
  a first capacitor coupled to the gates of the transistors in the first pair of transistors in the second stage;
  a first resistor coupled between the first capacitor and an output node for the first pair of transistors in the second stage;
  a second capacitor coupled to the gates of the transistors in the second pair of transistors in the second stage; and
  a second resistor coupled between the first capacitor and an output node for the second pair of transistors in the second stage.

11. A method for a two-stage differential amplifier, comprising:
  driving a first stage differential output signal across a pair of first stage output nodes for a first stage in the two-stage differential amplifier responsive to a differential input signal;
  controlling a current through a first bias transistor to supply an internal power supply rail, wherein controlling the current through the first bias transistor comprises driving a gate of a first p-type metal oxide semiconductor (PMOS) bias transistor coupled between the internal power supply rail and a first power supply rail with a first bias signal; and
  driving a second stage differential output signal across a pair of second stage output nodes in a second stage for the two-stage differential amplifier responsive to the first stage differential output signal while powering the second stage from the internal power supply rail.

12. The method of claim 11, further comprising:
biasing the first stage with a second PMOS bias transistor coupled to a second power supply rail and with an n-type metal oxide semiconductor (NMOS) bias transistor coupled to ground.

13. The method of claim 12, wherein biasing the first stage comprises driving a gate of the second PMOS bias transistor with a second bias signal while driving a gate of the NMOS bias transistor with a third bias signal.

14. The method of claim 11, further comprising:
compensating the second stage differential output signal with a pair of resistive and capacitive compensation circuits.

15. A two-stage differential amplifier, comprising:
a first stage including two pairs of transistors configured to drive a pair of first stage output nodes with a first stage output signal responsive to a differential input signal, wherein each pair of transistors in the first stage comprises a p-type metal oxide semiconductor (PMOS) transistor in series with an n-type metal oxide semiconductor (NMOS) transistor;
a second stage including two pairs of transistors configured to drive a pair of second stage output nodes with a second stage output signal responsive to the first stage output signal, wherein each pair of transistors in the second stage comprises a PMOS transistor in series with an NMOS transistor, and wherein a first one of the first stage output nodes couples to a first one of the second stage output nodes through a first serial combination of a capacitor and a resistor; and
means for supplying a controlled amount of current to the second stage without degenerating a transconductance gain for the second stage.

16. The two-stage differential amplifier of claim 15, wherein a second one of the first stage output nodes couples to a second one of the second stage output nodes through a second serial combination of a capacitor and a resistor.

* * * * *